(12) United States Patent
Chuang et al.

(10) Patent No.: US 8,426,925 B2
(45) Date of Patent: Apr. 23, 2013

(54) MEMORY DEVICE AND METHOD OF FABRICATING THE SAME

(75) Inventors: Ying Cheng Chuang, Taoyuan County (TW); Ping Cheng Hsu, Taipei (TW); Sheng Wei Yang, Taoyuan County (TW); Ming Cheng Chang, Taipei County (TW); Hung Ming Tsai, Kaohsiung (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 164 days.

(21) Appl. No.: 12/945,536

(22) Filed: Nov. 12, 2010

(65) Prior Publication Data
US 2012/0119277 A1    May 17, 2012

(51) Int. Cl.
  *H01L 29/76* (2006.01)
  *H01L 29/94* (2006.01)
  *H01L 31/062* (2012.01)
  *H01L 31/113* (2006.01)
  *H01L 31/119* (2006.01)

(52) U.S. Cl.
  USPC ........... 257/396; 257/296; 257/301; 257/506; 257/E21.006; 257/E21.027; 257/E21.094; 257/E21.229; 257/E21.267; 257/E21.304; 257/E21.546; 257/E21.645; 257/E21.646

(58) Field of Classification Search .................. 257/396, 257/295, 301, 311, 330, 332, 314, 506, 763, 257/257/E21.006, E21.027, E21.058, E21.094, 257/E21.229, E21.267, E21.304, E21.546, 257/E21.645, E21.646
See application file for complete search history.

(56) References Cited

U.S. PATENT DOCUMENTS

| | | | | |
|---|---|---|---|---|
| 6,734,482 B1 * | 5/2004 | Tran et al. | ...................... | 257/296 |
| 6,756,625 B2 * | 6/2004 | Brown | .......................... | 257/300 |
| 6,905,944 B2 * | 6/2005 | Chudzik et al. | ............... | 438/435 |
| 7,521,322 B2 * | 4/2009 | Tang et al. | ..................... | 438/270 |
| 2005/0063233 A1 | 3/2005 | Brown | | |

OTHER PUBLICATIONS

Co-pending U.S. Appl. No. 12/945423, filed Nov. 12, 2010.

* cited by examiner

*Primary Examiner* — David Nhu
(74) *Attorney, Agent, or Firm* — Hamre, Schumann, Mueller & Larson, P.C.

(57) ABSTRACT

A memory device includes a plurality of isolations and trench fillers arranged in an alternating manner in a direction, a plurality of mesa structures between the isolations and trench fillers, and a plurality of word lines each overlying a side surface of the respective mesa. In one embodiment of the present invention, the width measured in the direction of the trench filler is smaller than that of the isolation, each mesa structure includes at least one paired source/drain regions and at least one channel base region corresponding to the paired source/drain regions, and each of the word lines is on a side surface of the mesa structure, adjacent the respective isolation, and is arranged adjacent the channel base region.

16 Claims, 19 Drawing Sheets

MEMORY DEVICE AND METHOD OF FABRICATING THE SAME

1. TECHNICAL FIELD

The present invention relates to a memory device, and more particularly, relates to a memory device with a trench cell structure and a method of fabricating the same.

2. BACKGROUND

Due to structural simplicity, DRAMs (dynamic random access to memories) can provide more memory cells per unit chip area than other types of memories such as static random access memories. A DRAM is constituted by a plurality of DRAM cells, each of which includes a capacitor for storing information and a transistor coupled to the capacitor for regulating when the capacitor is charged or discharged. During a read operation, a word line is asserted, turning on the transistor. The enabled transistor allows the voltage across the capacitor to be read by a sense amplifier through a bit line. During a write operation, the data to be written is provided on the bit line while the word line is asserted.

To satisfy the demand for greater memory storage, DRAM memory cells need size reduction. DRAM memory cell size can be reduced in several ways. One way is to reduce the minimum feature size of a DRAM memory cell through the advances in process technology. Another way to reduce the size of a DRAM memory cell is by designing a memory cell having a smaller feature size. For example, many DRAM chips on the market today have a memory cell size of $6F^2$, where F stands for the photolithographic minimum feature width or critical dimension (CD).

However, as the size of memory cells decreases, a lot of issues emerge. For example, the disturbance between memory cells or between word lines may easily occur. The resistance of the word line increases due to the decrease of its cross-sectional area. In addition, the reduction of the areas of capacitors and bit line contacts increase the contact resistance.

SUMMARY

One aspect of the present invention provides an embodied memory device comprising a plurality of isolations and a plurality of trench fillers arranged in an alternating manner in a direction, a plurality of mesa structures between the isolations and trench fillers, and a plurality of word lines each overlying a side surface of the respective mesa. In one embodiment of the present invention, the width measured in the direction of the trench filler is smaller than that of the isolation, each mesa structure includes at least one paired source/drain regions and at least one channel base region corresponding to the paired source/drain regions, and each of the word lines is on the sidewall of a respective mesa structure, adjacent the respective isolation, and is arranged adjacent the channel base region.

Another aspect of the present invention provides first and second isolations having a width and separated from each other by a distance approximately equal to the width, a trench filler between the first and second isolations, a first mesa structure disposed between the first isolation and the trench filler and a second mesa structure disposed between the second isolation and the trench filler, a first word line between the first isolation and the first mesa structure, adjacent the channel base region of the first mesa structure, and a second word line between the second isolation and the second mesa structure, adjacent the channel base region of the second mesa structure, wherein each of the first mesa structure and the second mesa structure includes at least one paired source/drain regions and at least one channel base region corresponding to the paired source/drain regions of the first mesa structure.

Another aspect of the present invention provides a method of fabricating a memory device comprising the steps of forming a plurality of first insulative blocks and a plurality of second insulative blocks arranged in an alternating manner in a substrate, forming a plurality of wide trenches in the substrate to form a plurality of protruding blocks, forming a word line on each sidewall of the protruding blocks, isolating the word line on each sidewall of the protruding block, and forming an trench filler in the protruding block to form two mesa structures, wherein the first insulative block and the second insulative block have different depths, and the wide trenches are transverse to the first insulative blocks.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 1:
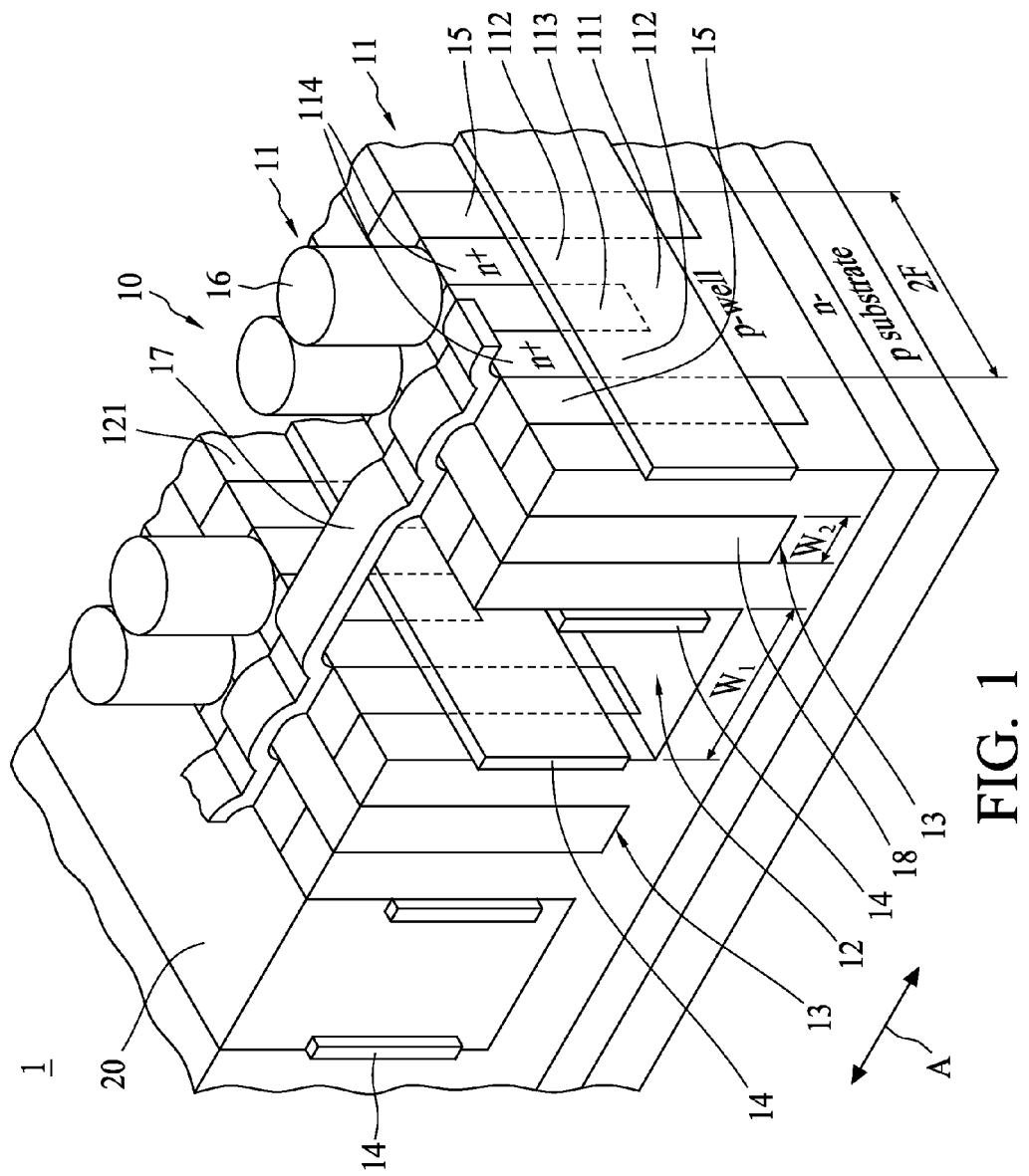
FIG. 1 is a perspective view of a memory device according to one embodiment of the present invention.

FIG. 1 is a perspective view of a memory device 1 according to one embodiment of the present invention. Referring to FIG. 1, the memory device 1 comprises a plurality of mesa structures 11, a plurality of wide trenches 12 filled with dielectric material to form isolations 20, a plurality of narrow trenches 13 filled with dielectric material to form trench fillers 18, and a plurality of word lines 14. The trenches 12 and the trenches 13 are arranged in an alternating manner in a direction A, wherein the width $W_2$ of the trench 13, measured in the direction A, is smaller than the width $W_1$ of the trench 12. In one embodiment of the present invention, the width $W_1$ of the trench 12 can be approximately equal to the photolithographic minimum feature width F, and the width $W_2$ of the trench 13 can be approximately half the photolithographic minimum feature width F.

Each mesa structure 11, disposed between adjacent corresponding trench 12 and trench 13, includes at least one channel base region 111 each having two separated protrusions 112 extending upwards from the channel base region 111, at least one isolation pillar 113 formed using any suitable dielectric material such as silicon oxide and corresponding to the channel base region 111, at least one paired source/drain regions 114 corresponding to the channel base region 111. The two separated protrusions 112 of the channel base region 111 separately connects the paired source/drain regions 114, and the isolation pillar 113 separates the paired source/drain regions 114 and the two separated protrusions 112 of the channel base region 111.

Each mesa structure 11 further comprises a plurality of isolation structures 15 made of any suitable dielectric material such as silicon oxide. Two adjacent isolation structures 15 define the respective paired source/drain regions 114 and the respective channel base region 111. In one embodiment of the present invention, a capacitor 16 connects one source/drain region 114, and another source/drain region 114 connects a corresponding bit line 17 for performing reading or writing operations.

In one embodiment, the source/drain regions 114 can be of a second conductivity type (n+) and the channel base region 111 can be of a first conductivity type (p−). If a p-channel device is desired, the doping types and levels of the elements of the transistor can be adjusted, as is well known in the art. In one embodiment, the memory cell 10 has an area of approximately $4F^2$ or less, where F is the minimum lithographic feature size.

The trench filler 18 can be formed by filling the trench 13 with dielectric material such as silicon oxide to separate two adjacent mesa structures 11 arranged in the direction A. The trench filler 18 can minimize the disturbance between the two adjacent mesa structures 11 arranged in the direction A.

Figure 2:
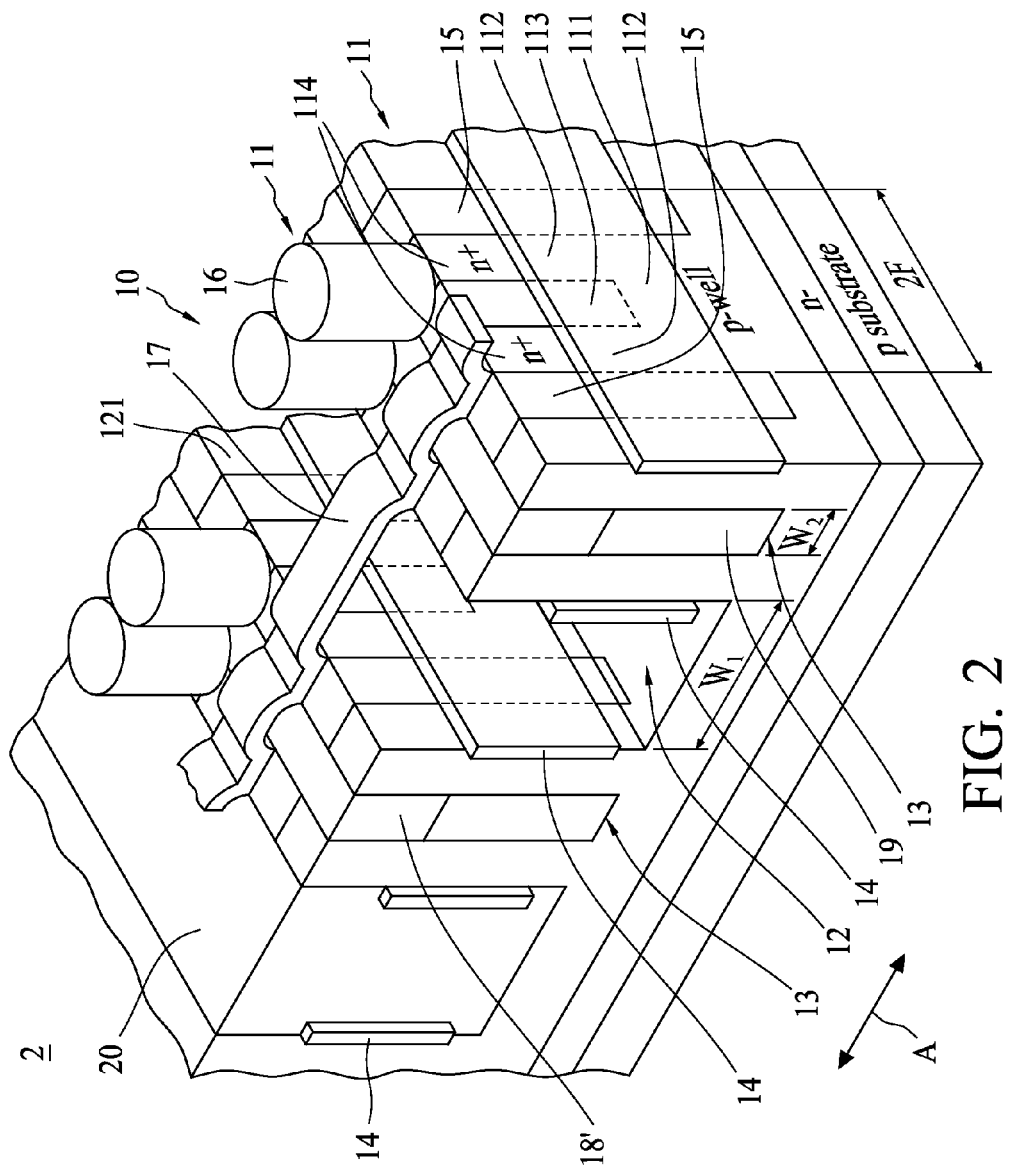
FIG. 2 is a perspective view of a memory device according to another embodiment of the present invention.

In a memory device 2 according to another embodied of the present invention as shown in FIG. 2, the trench 13 can be initially filled with conductive material such as titanium nitride to form a potential line 19, which is electrically coupled to the channel base region 111 disposed around the trench 13. After the potential lines 19 are formed, dielectric material is then filled into the trenches 13 above the potential lines 19 so that trench fillers 18' are formed. The potential line 19 can also minimize the disturbance between the two adjacent mesa structures 11 arranged in the direction A. The potential lines 19 can be supplied with a fixed potential so as to avoid floating body threshold voltage instabilities.

Referring to FIGS. 1 and 2, in each trench 12, two word lines 14 are formed and oriented vertically widthwise along the side surfaces 121 of adjacent mesa structures 11. Each word line 14 serving as the transistor gates overlies a respective side surface 121, disposed adjacent channel base region 111. Between each word line 14 and its corresponding mesa structure 11, an oxide layer (not shown) is present. The word line 14 can be formed of, for example, titanium nitride, or any suitable conductive material. Specifically, each trench 12 filled with dielectric material forms the isolation 20 to electrically isolate two word lines 14 from each other. Furthermore, the word lines 14 overlie on the side surfaces 121 of the mesa structure 11, separated from each other to the greatest possible extent so that the word lines 14 in the same trench 12 can be suitably isolated from one another so as to avoid the disturbance between the word lines 14. In addition, the word line 14 is oriented vertically such that it can be formed wider to lower its resistance while not being limited by the confined area of the memory cell 10.

Figure 3:
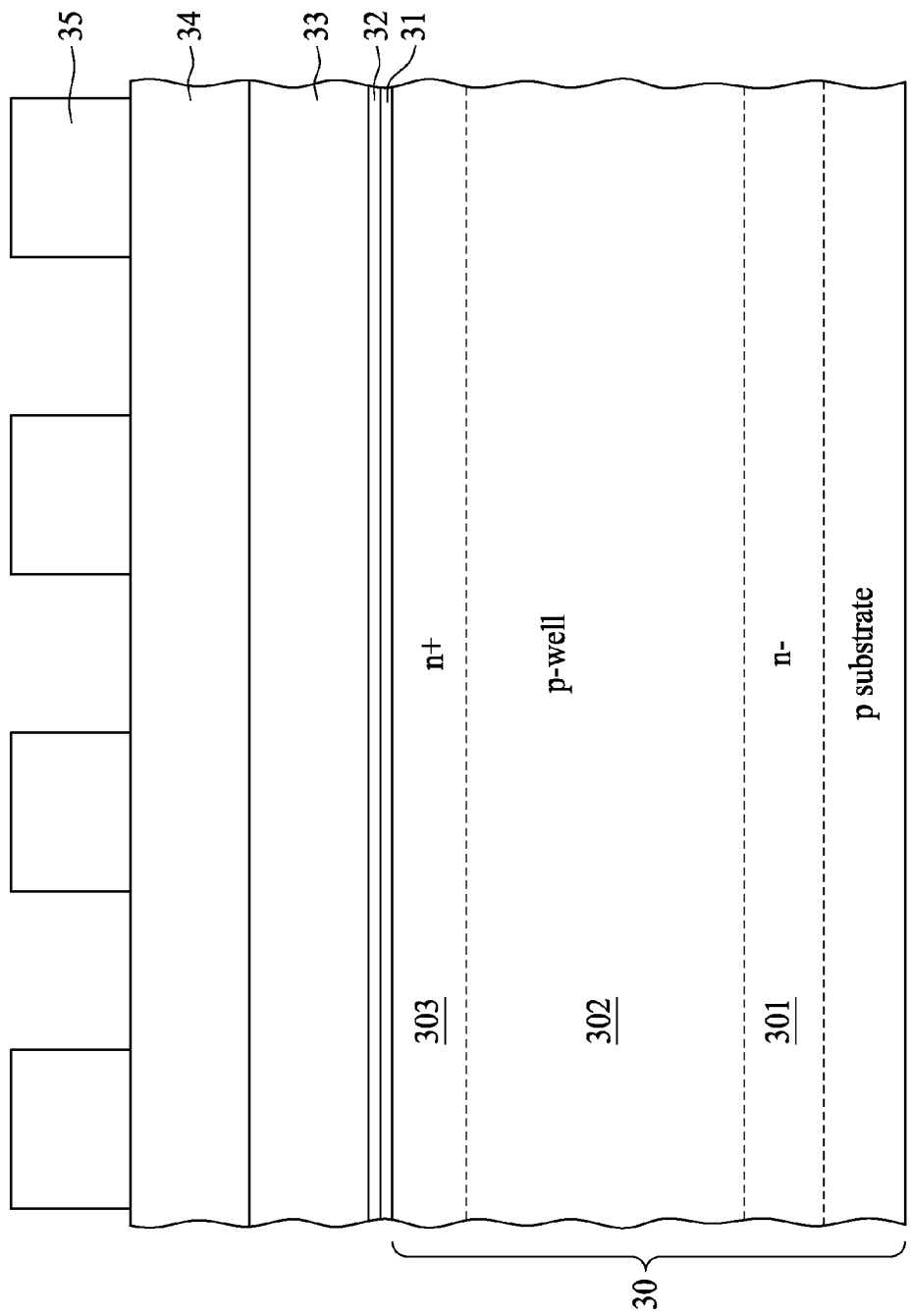
FIGS. 3 through 7 are cross-sectional views showing process steps for forming isolations for defining cell transistors according to one embodiment of the present invention.

The memory devices 1 and 2 are fabricated through processes described as follows, illustrated by FIGS. 3 through 19. Referring to FIG. 3, a substrate 30 is initially processed to include a layer 301 of a second conductivity type (n−), a layer 302 of a first conductivity type (p−) on the layer 301, and a layer 303 of a second conductivity type (n+) on the layer 302. The substrate 30 is a silicon substrate in the present embodiment, while it can be any type of substrate for different purposes. The substrate 30 can be undoped or doped, but a p+ type doped wafer is preferred. Next, an oxide layer 31, a nitride layer 32, a polysilicon layer 33, a tetraethyl orthosilicate (TEOS) layer 34 and a photoresist layer 35 are formed on the top of the substrate 30 by suitable means such as a chemical deposition process or a spin-on process. The photoresist layer 35 is then patterned to define a line and space pattern by photolithographic techniques. In one embodiment, the photoresist layer 35 includes a plurality of lines spaced apart from each other by a distance, which can be the photolithographic minimum feature width (F).

Figure 4:
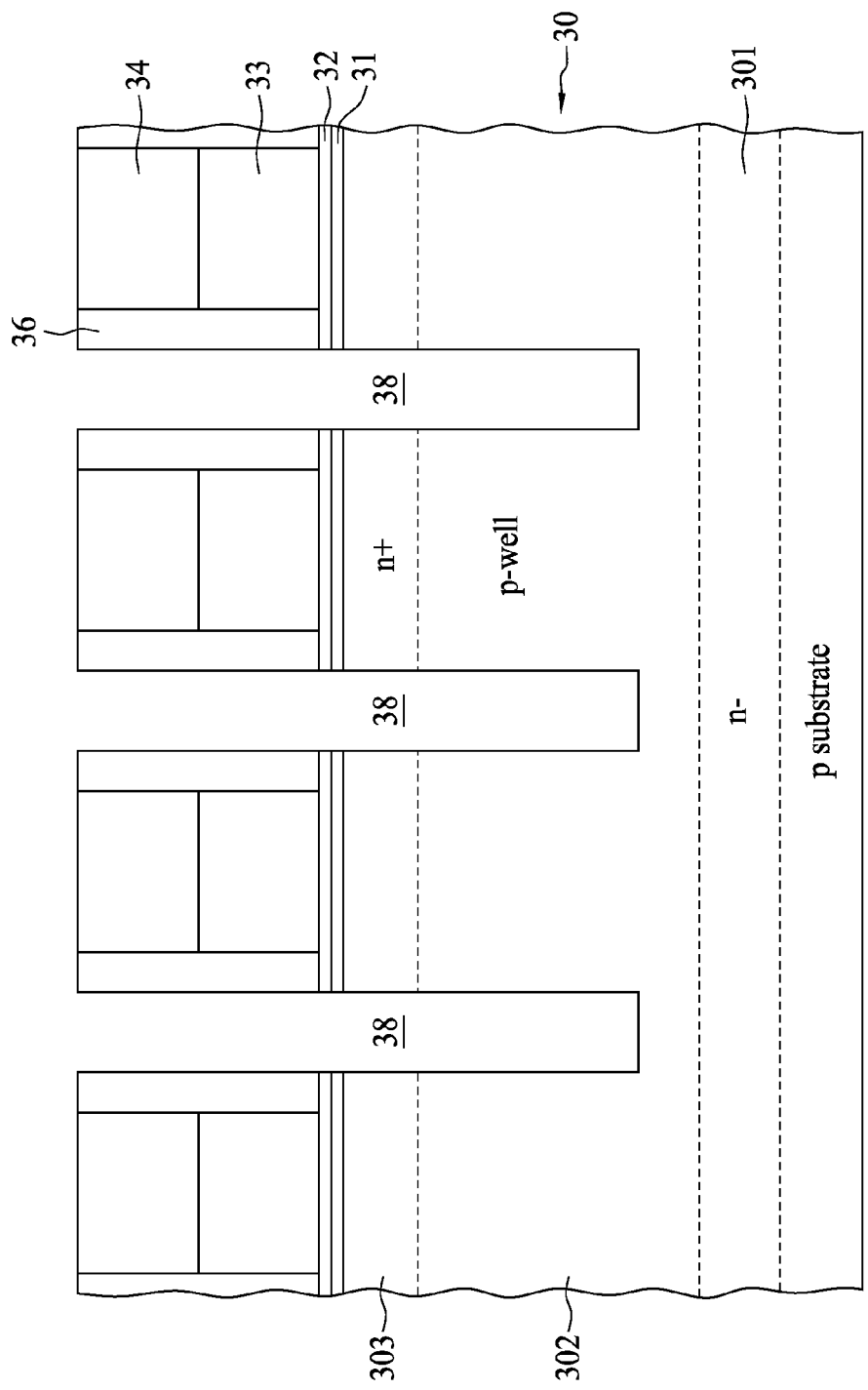

As shown in FIG. 4, the TEOS layer 34 is etched to form a line-and-space pattern therein with the patterned photoresist layer 35 acting as an etching mask. Then, the etched TEOS layer 34 is used as a hard mask to perform another etching process to remove a portion of the polysilicon layer 33 so as to form a line-and-space pattern therein. Thereafter, the photoresist layer 35 is removed, and sidewall spacers 36 made of silicon oxide are formed on the sidewalls of the lines of the patterned polysilicon layer 33 and TEOS layer 34. The sidewall spacers 36 are formed to an extent that two sidewall spacers 36 facing each other are spaced by a distance approximately equal to one-half of the photolithographic minimum feature width (F). Next, a dry etch process such as plasma etching or reactive ion etching is performed to etch the exposed regions of the layer 303 between the sidewall spacers 36, through the nitride layer 32 and the oxide layer 31, and into the layer 302 below the layer 303 to form a plurality of trenches 38 with a width of approximately one-half of the photolithographic minimum feature width (F).

Figure 5:
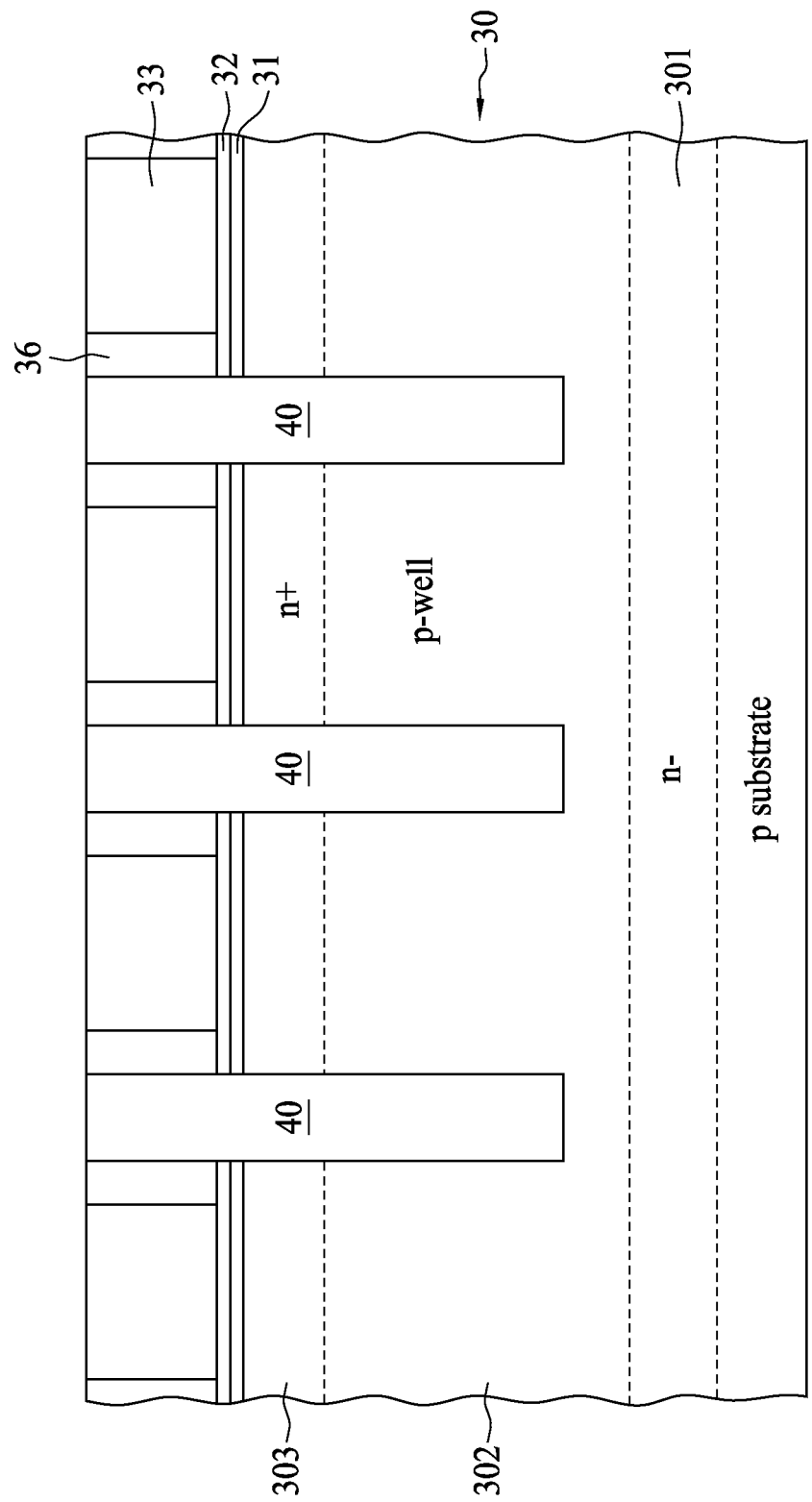

Referring to FIG. 5, dielectric material is deposited to fill the plurality of trenches 38 by a spin-on process or a chemical vapor deposition process. Next, a chemical mechanical polishing (CMP) process is used to remove a portion of the dielectric material above the polysilicon layer 33 to form a plurality of insulative blocks 40 in the trenches 38.

Figure 6:
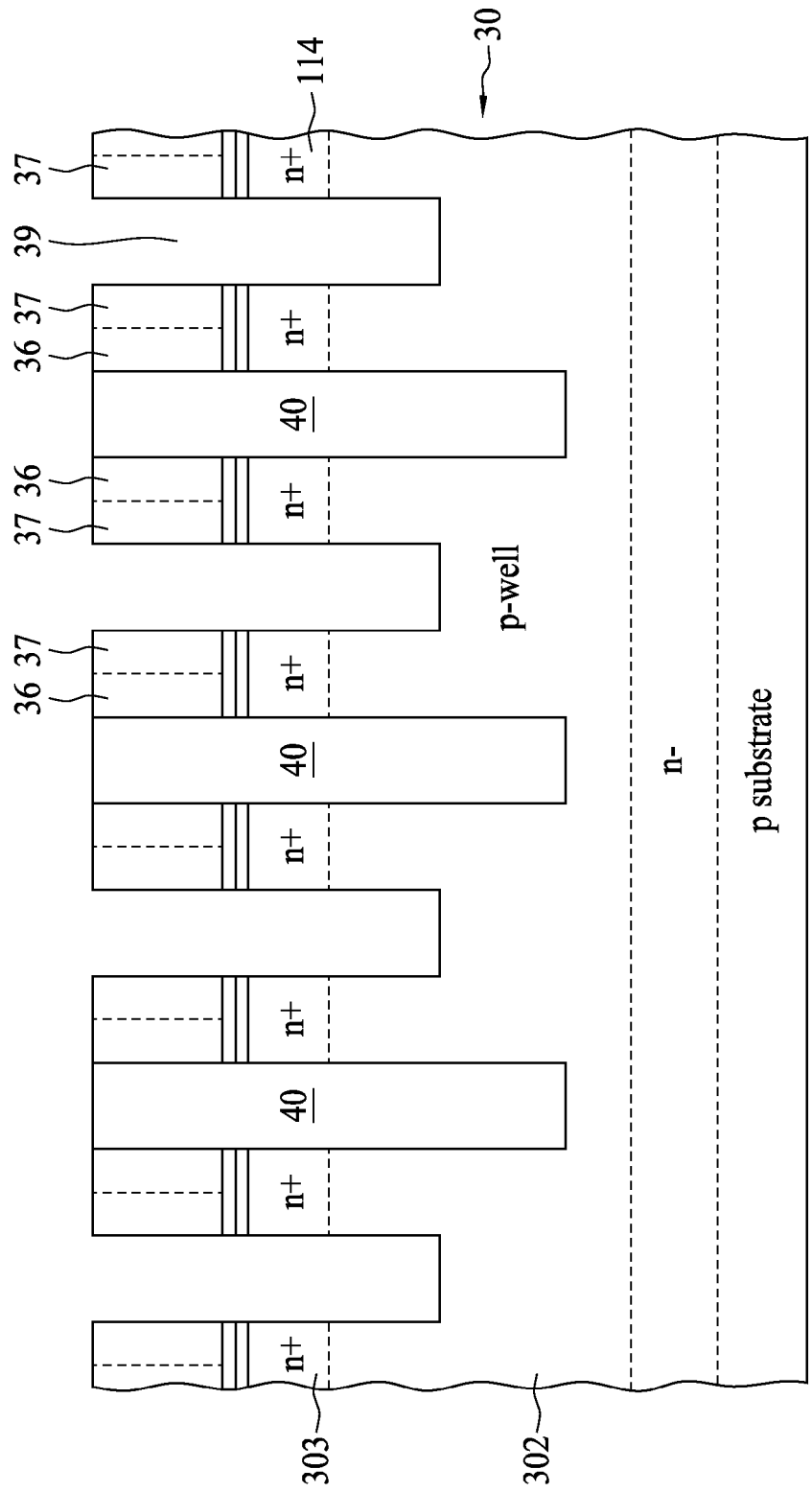

As illustrated in FIG. 6, the polysilicon layer 33 is stripped to expose the underlying nitride layer 32 by a suitable stripping technique. Thereafter, sidewall spacers 37 made of silicon oxide are formed on the sidewall spacers 36, and two sidewall spacers 37 facing each other define a groove having a width of approximately one-half of the photolithographic minimum feature width (F). Next, through the grooves, a dry etch process such as plasma etching or reactive ion etching is performed to etch the regions of the layer 303 beneath the grooves, through the nitride layer 32 and the oxide layer 31, and into the layer 302 in the substrate 30 to form a plurality of trenches 39 with a width of approximately one-half of the photolithographic minimum feature width (F), wherein the trench 39 is shallower than the trench 38. The trench 39 separates the layer 303 to form source/drain regions 114 in the substrate 30.

Figure 7:
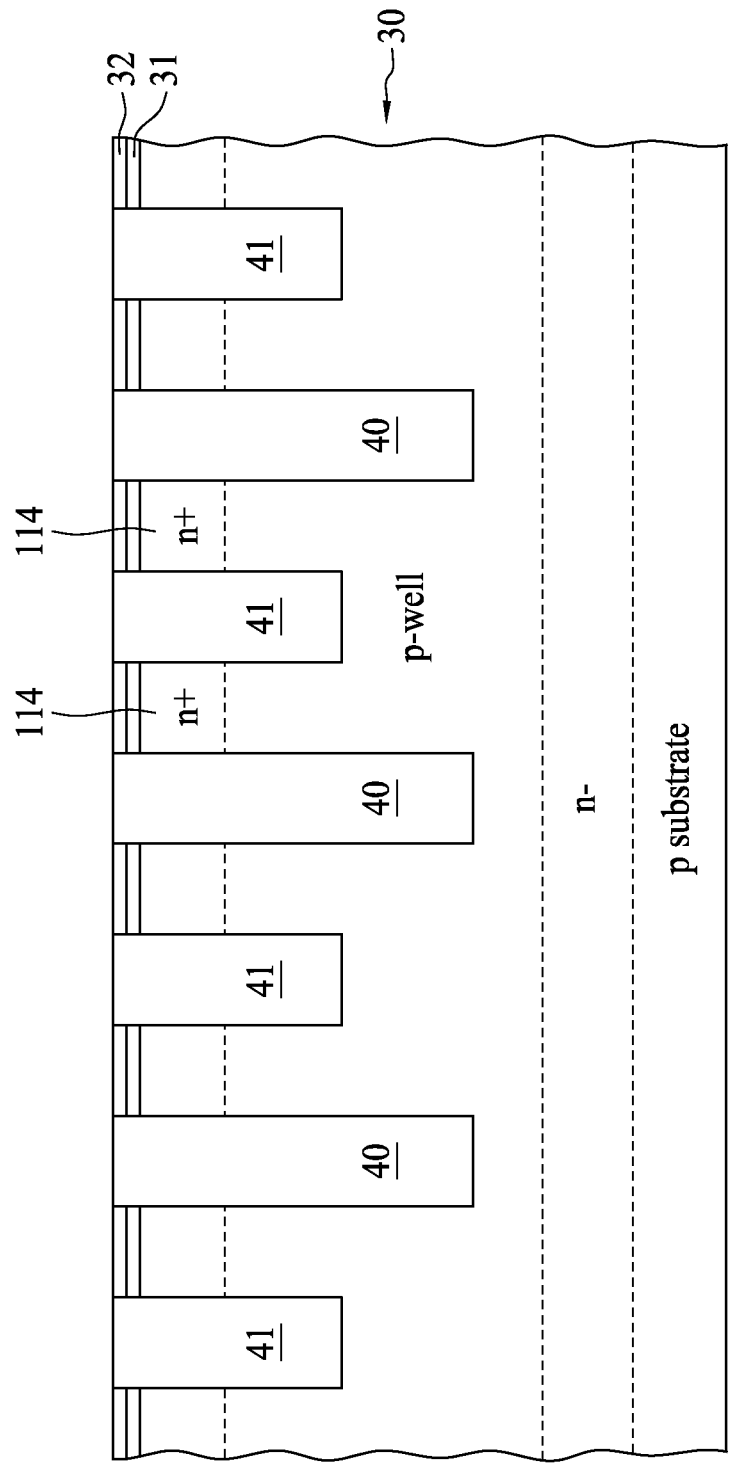

Referring to FIG. 7, the trench 39 is then filled with dielectric material by a deposition process, and a CMP process is then performed to remove a portion of the dielectric material above the nitride layer 32. The CMP process is stopped at the nitride layer 32 to form a plurality of insulative blocks 41 in the trenches 39. Each insulative block 41 separates two source/drain regions 114 between two adjacent insulative blocks 40. In the present embodiment, the insulative block 40 is formed deeper than the insulative block 41.

Figure 8:
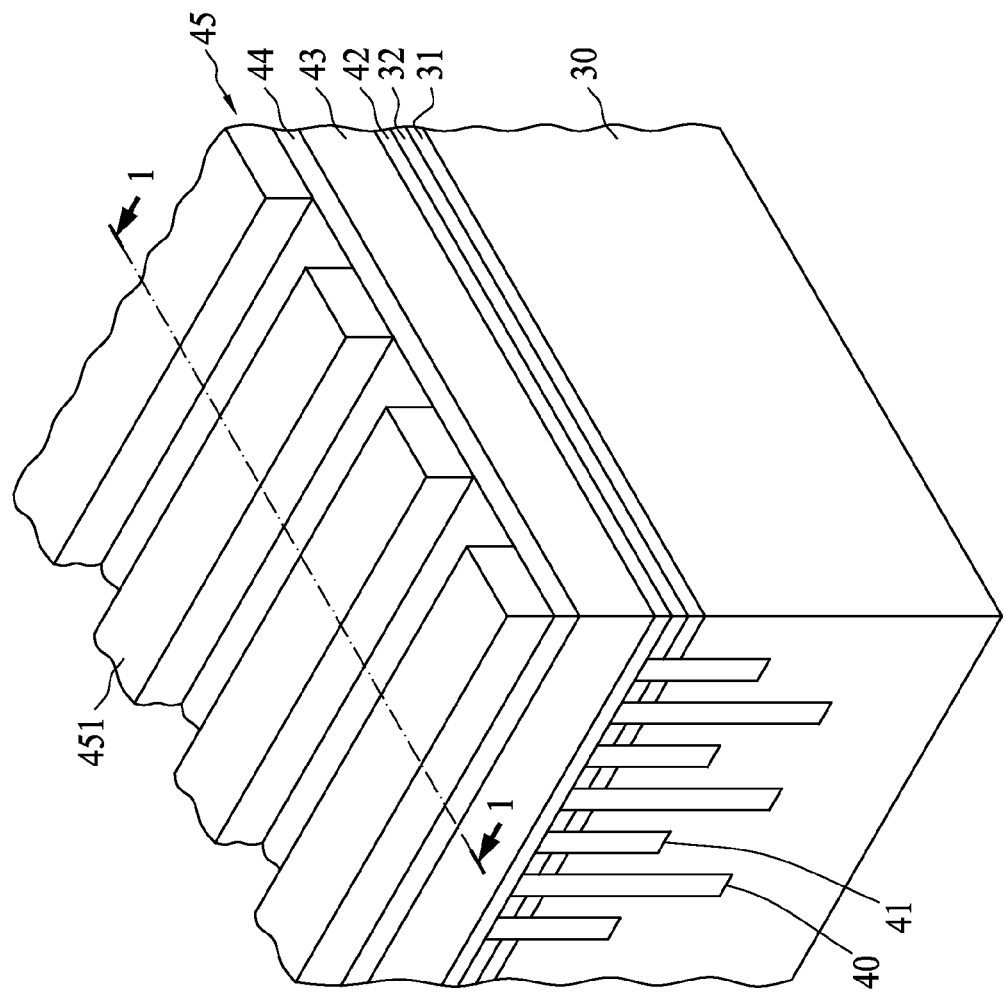
FIG. 8 is a perspective view showing a process step for forming trenches including word lines according to one embodiment of the present invention.
Figure 9:
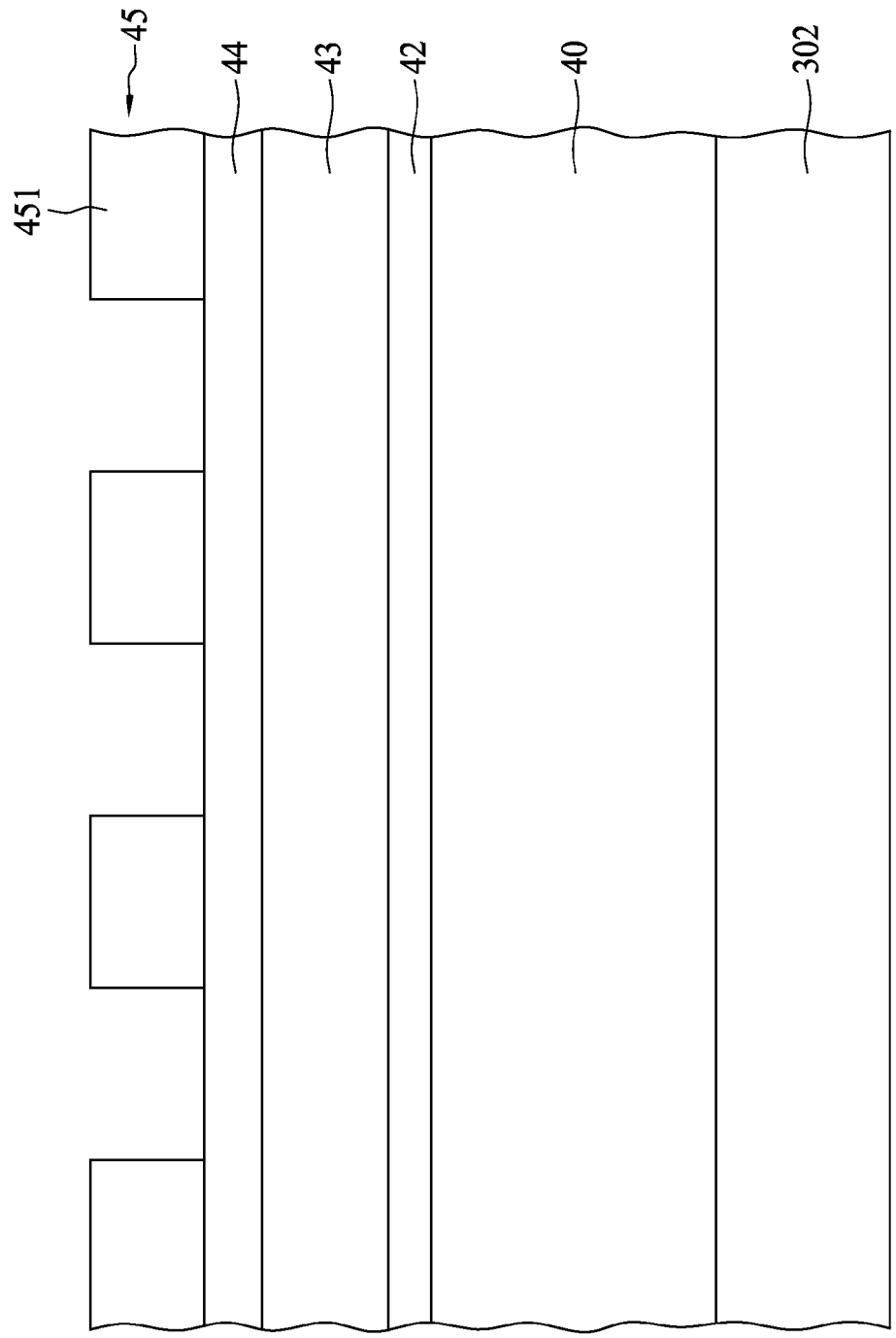
FIGS. 9 through 19 are cross-sectional views along line 1-1 of FIG. 8, showing process steps for forming trenches for including word lines and the isolations of the trenches according to one embodiment of the present invention.

Referring to FIGS. 8 and 9, silicon nitride is deposited to form a silicon nitride layer 42 on the nitride layer 32. Next, a polysilicon layer 43, a hard mask layer 44, and a photoresist layer 45 are formed by a deposition process or a spin-on process. The photoresist layer 45 is then patterned to form a is plurality of photoresist lines 451 extending transverse to the extension direction of the insulative blocks 40 and 41. In one embodiment, the photoresist line 451 has a width of approximately the photolithographic minimum feature width (F), and two adjacent photoresist lines 451 are spaced by a distance approximately equal to the photolithographic minimum feature width (F).

Figure 10:
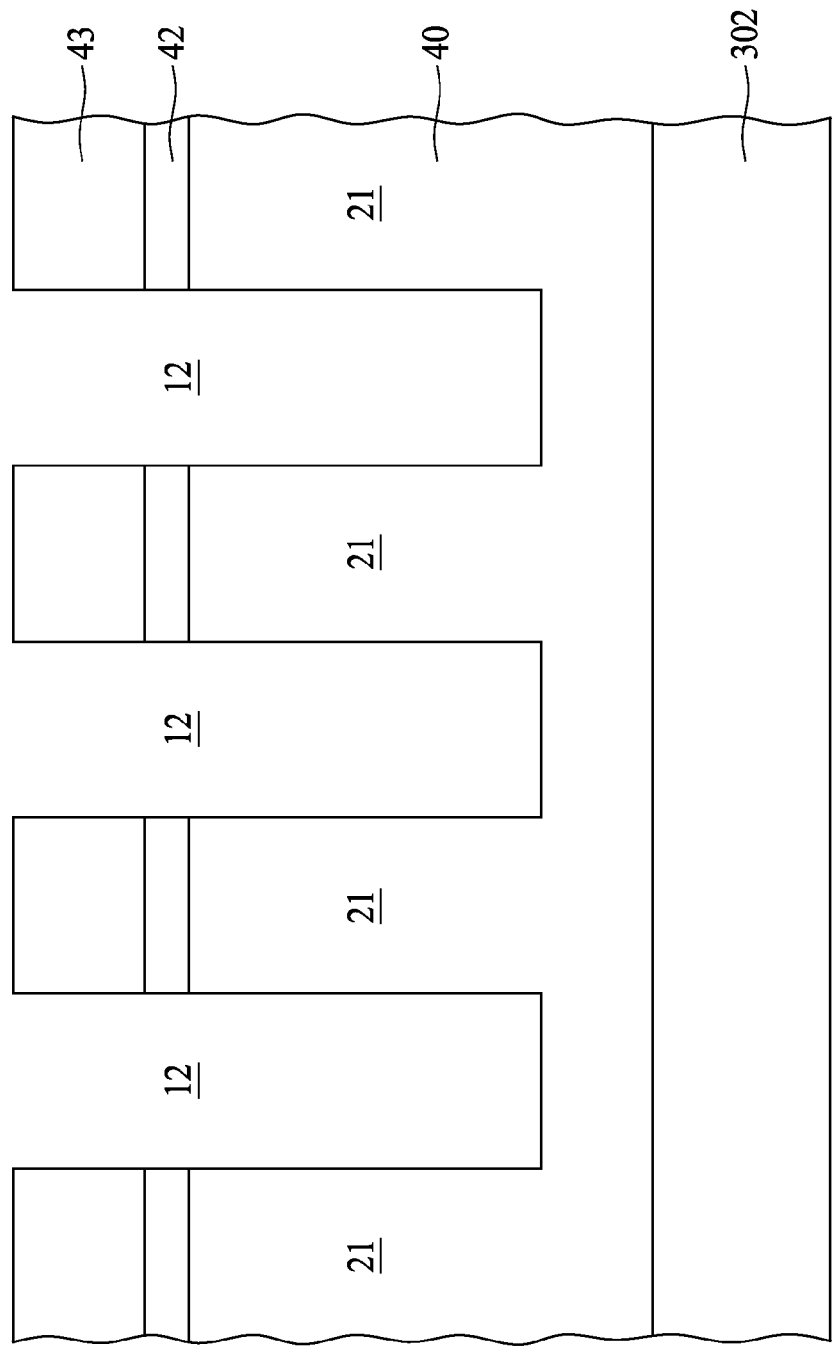

As shown in FIG. 10, the hard mask layer 44 is etched by a dry etch process by using the patterned photoresist layer 45 as the etching mask to form a plurality of wide trenches 12 to form a plurality of protruding blocks 21 by using the patterned hard mask layer 44 as the etching mask, wherein the wide trenches 12 are transverse to the insulative blocks 40. After that, the hard mask layer 44 and the patterned photoresist layer 45 are stripped. In one embodiment, the hard mask layer 44 can include a TEOS layer.

Figure 11:
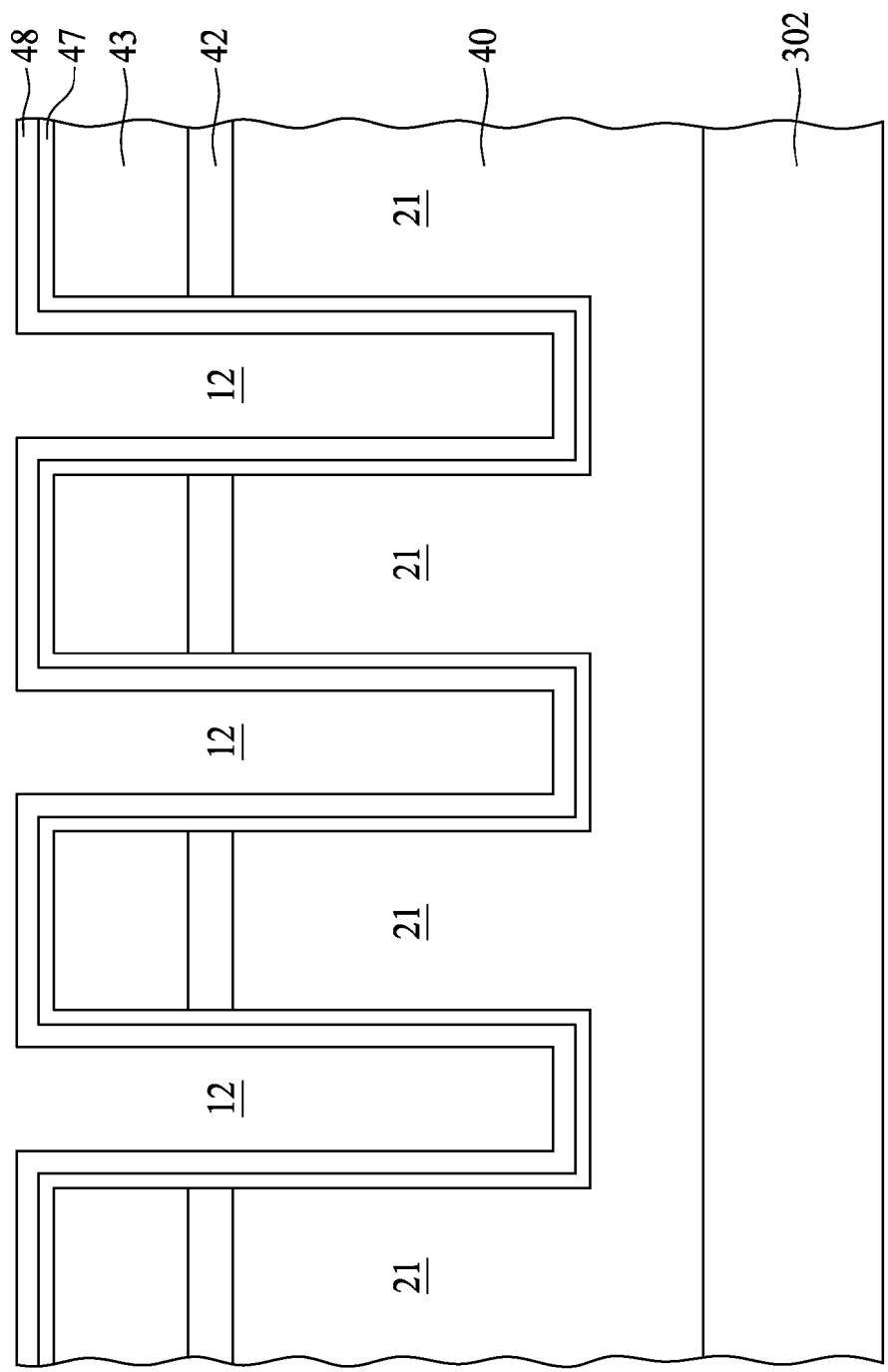
Figure 12:
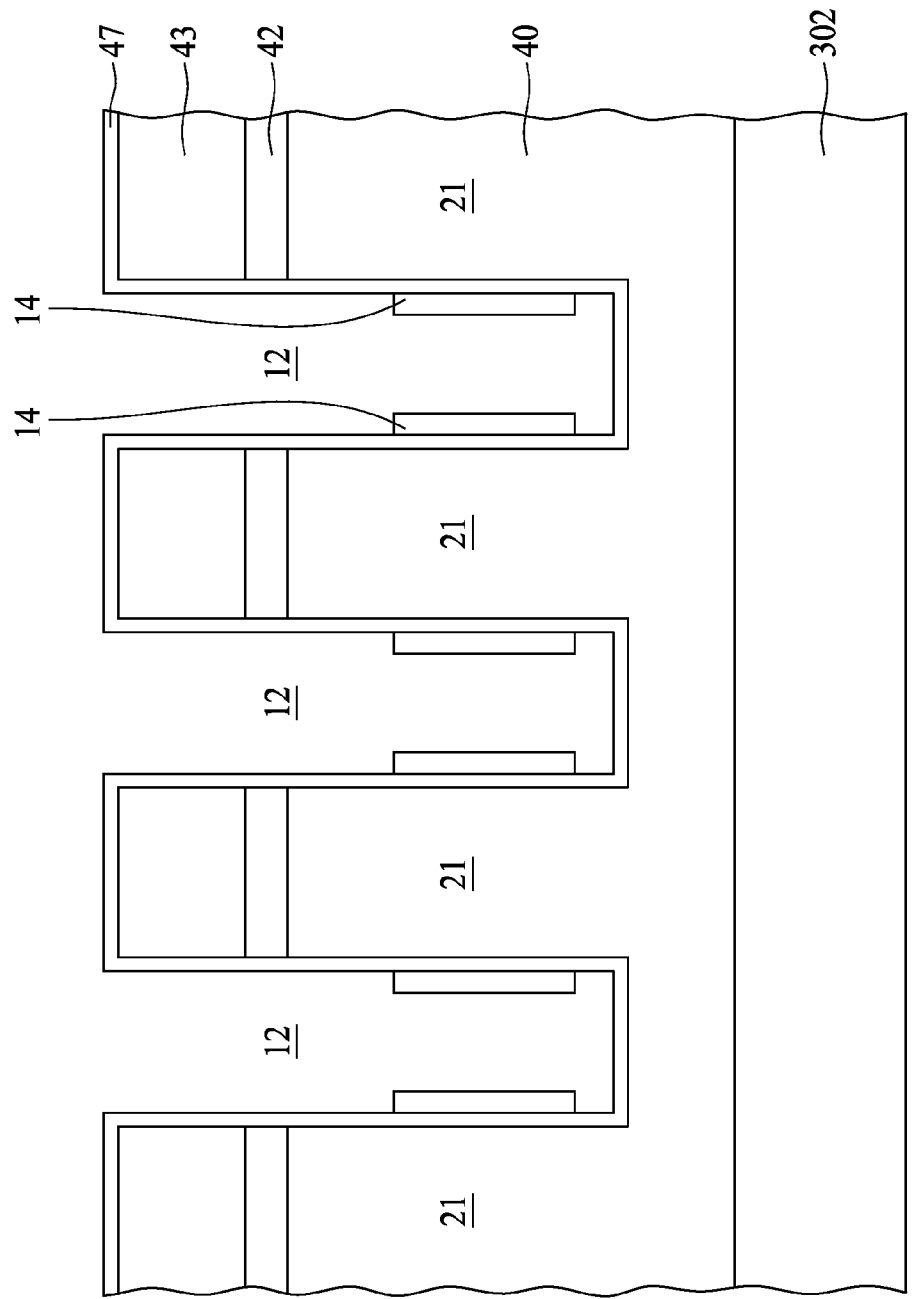

Referring to FIG. 11, a thin oxide layer 47 is formed, and a conductive layer 48 is then deposited on the thin oxide layer 47 by a suitable deposition process, wherein the conductive layer 48 may comprise a titanium nitride. Next, the conductive layer 48 is partially removed by an anisotropic etching process, leaving portions of the conductive layer 48 on the side surfaces of the protruding blocks 21, thereby forming a plurality of vertically oriented word lines 14 as shown in FIG. 12. It can be seen that the vertical length of the cross section of the word line 14 extending in parallel to the side surface of the protruding blocks 21 is greater than the horizontal length of the cross section of the word line 14, and word lines 14 with such a configuration can be more easily isolated from each other in the horizontal direction. In addition, the resistance of the word line 14 can be decreased by widening it vertically, with no significant impact on the size of memory cell 10.

Figure 13:
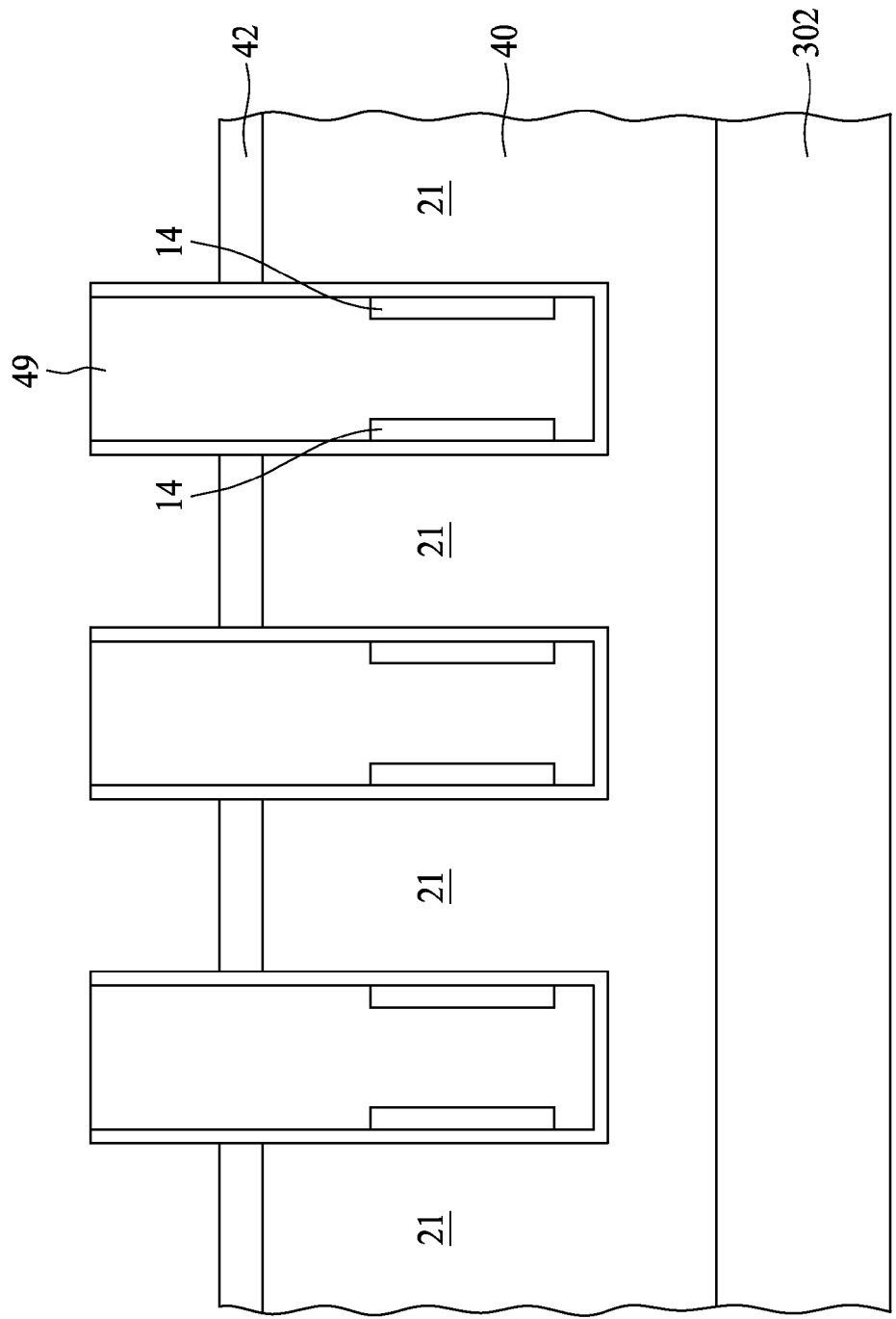

With reference to FIGS. 12 and 13, after the word lines 14 are formed, dielectric material 49 such as silicon dioxide is filled into the trenches 12. A CMP process is then carried out and stopped at the polysilicon layer 43. Next, the polysilicon layer 43 is stripped by a suitable stripping technique.

Figure 14:
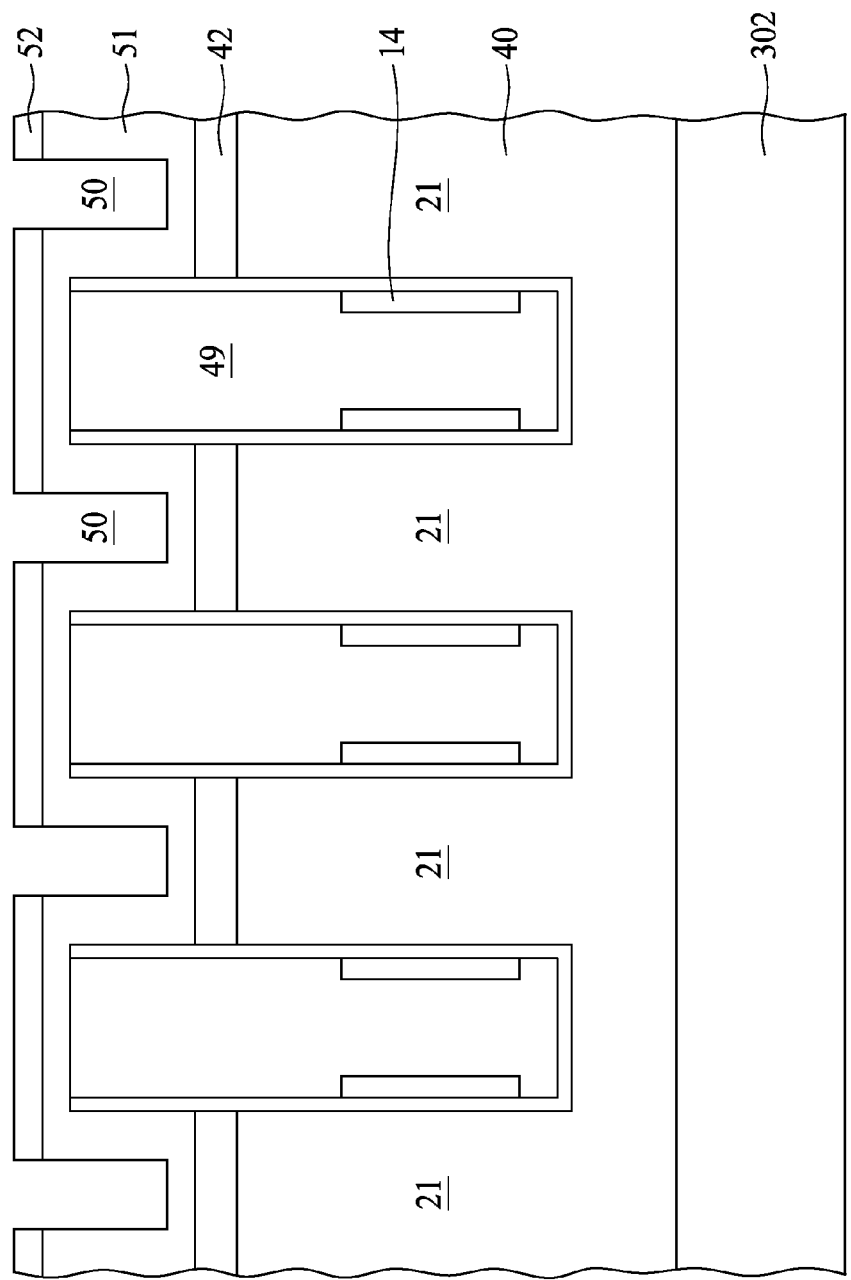

As shown in FIG. 14, a hard mask layer 51 of, for example, titanium nitride is deposited to form a plurality of depressions 50 having a width approximately equal to one-half the photolithographic minimum feature width (F). A non-conformal carbon layer 52 is subsequently deposited on the top of the hard mask layer 51 so as to expose only the bottoms of the depressions 50.

Figure 15:
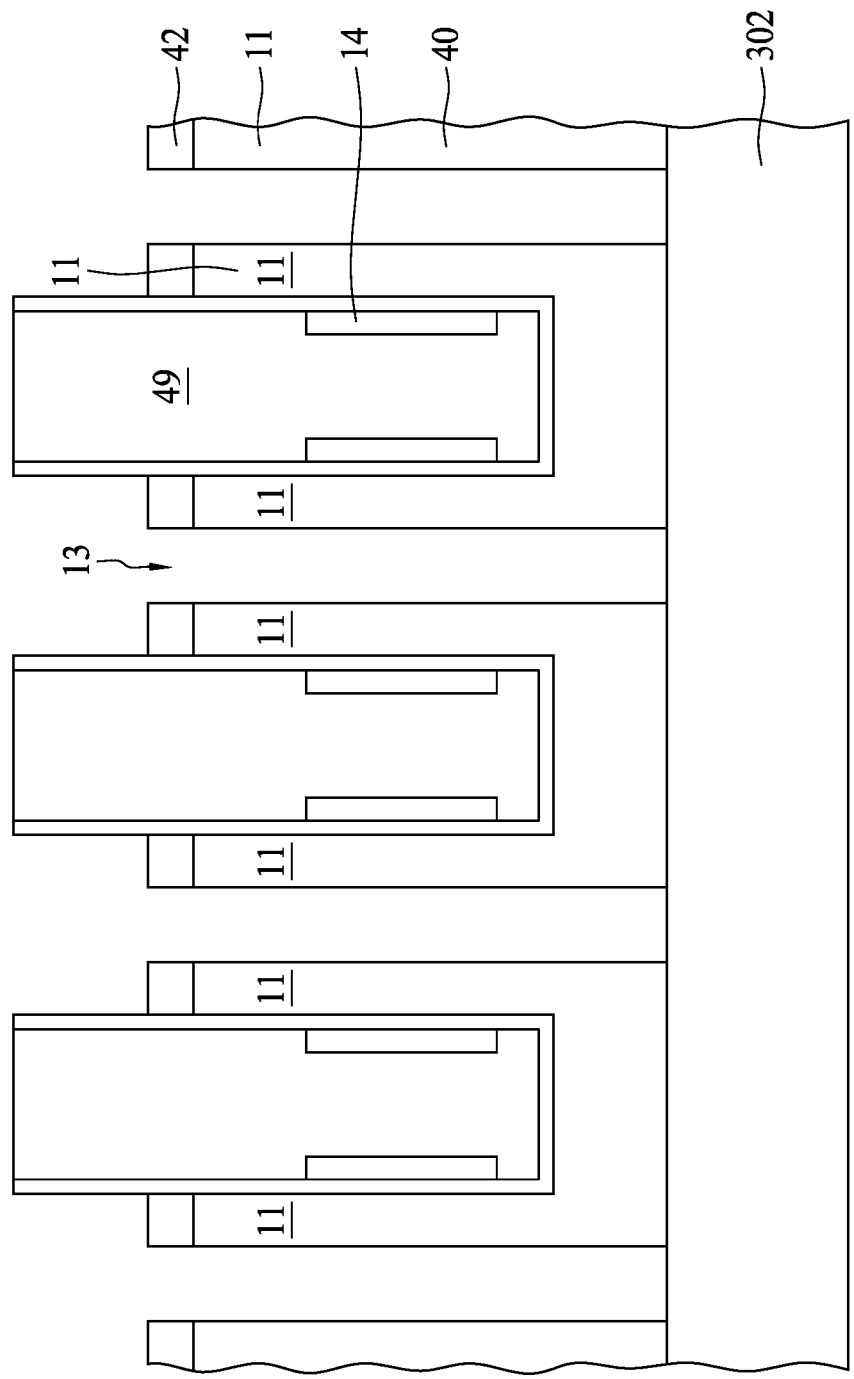

As illustrated in FIGS. 14 and 15, using the non-conformal carbon layer 52 as an etching mask, the hard mask layer 51 at the bottom of each depression 50 is removed by an etch process such as a dry etch process to form an opening, through which the silicon nitride layer 42 and the substrate 30 beneath the opening can be etched using, for example, a dry etch process to form a trench 13, which divides the respective protruding blocks 21 into two mesa structures 11. After the trenches 13 are formed, both the hard mask layer 51 and the non-conformal carbon layer 52 are removed using any suitable stripping process.

Figure 16:
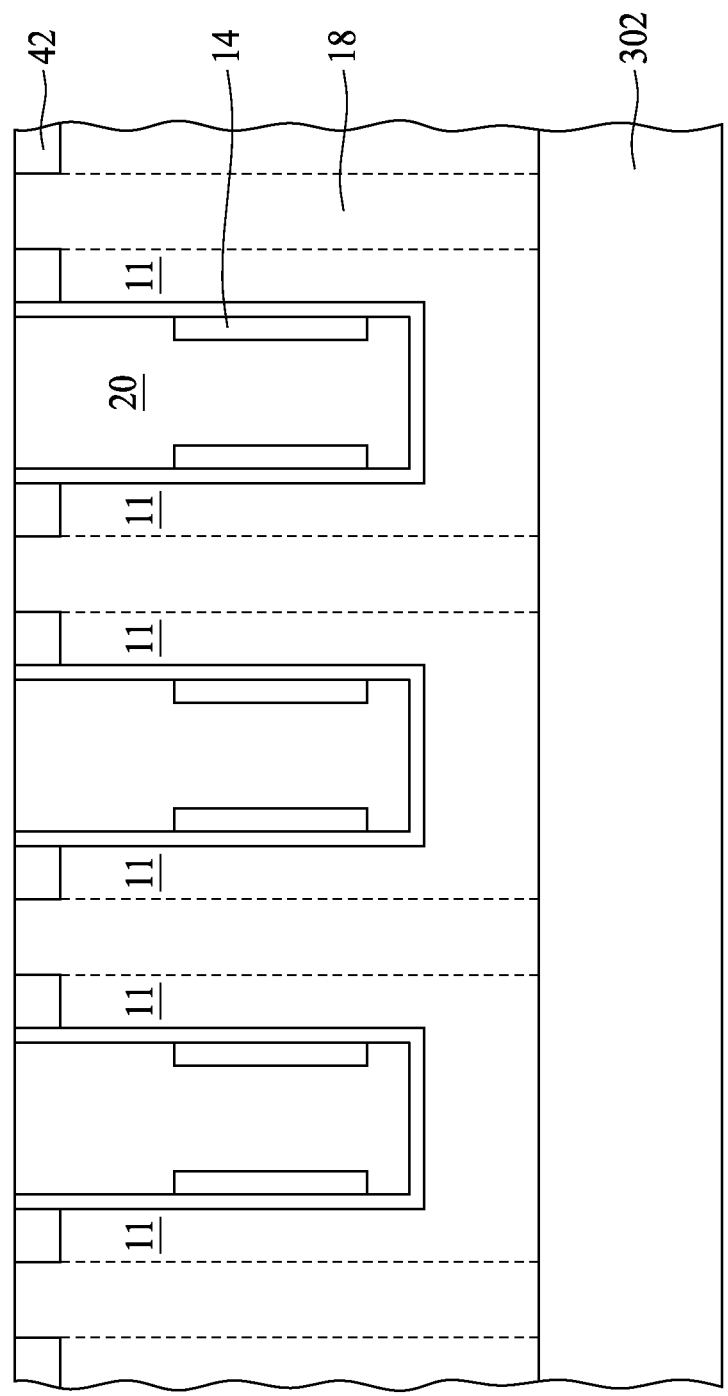

In one embodiment of the present invention, the trenches 13 can be filled with dielectric material. A CMP process is then employed, stopped at the silicon nitride layer 42, to form alternatively arranged isolations 18 and isolations 20 as shown in FIG. 16. Next, referring to FIG. 1, capacitors 16 and bit lines 17 are formed, connecting respective source/drain regions 114 to form the memory device 1.

Figure 17:
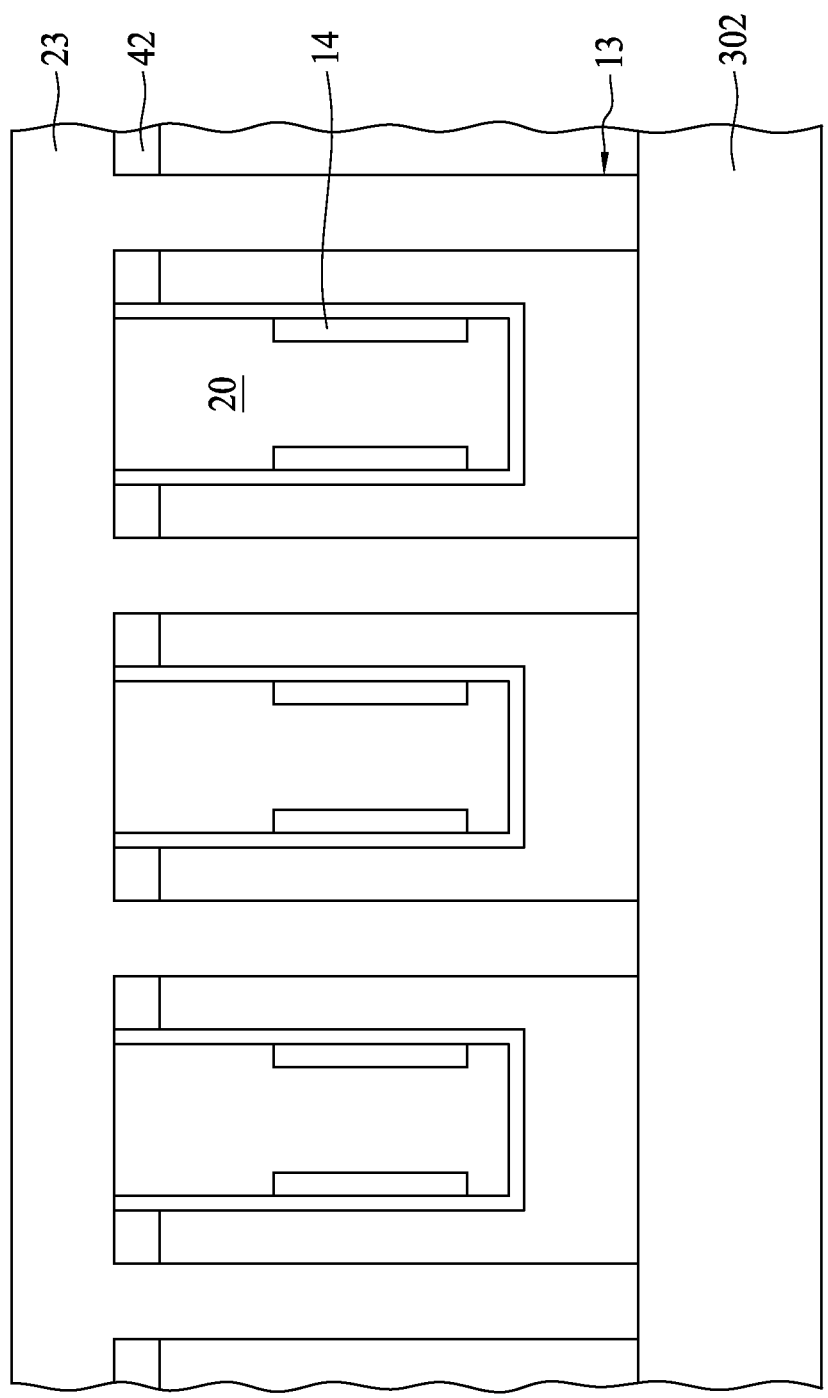
Figure 18:
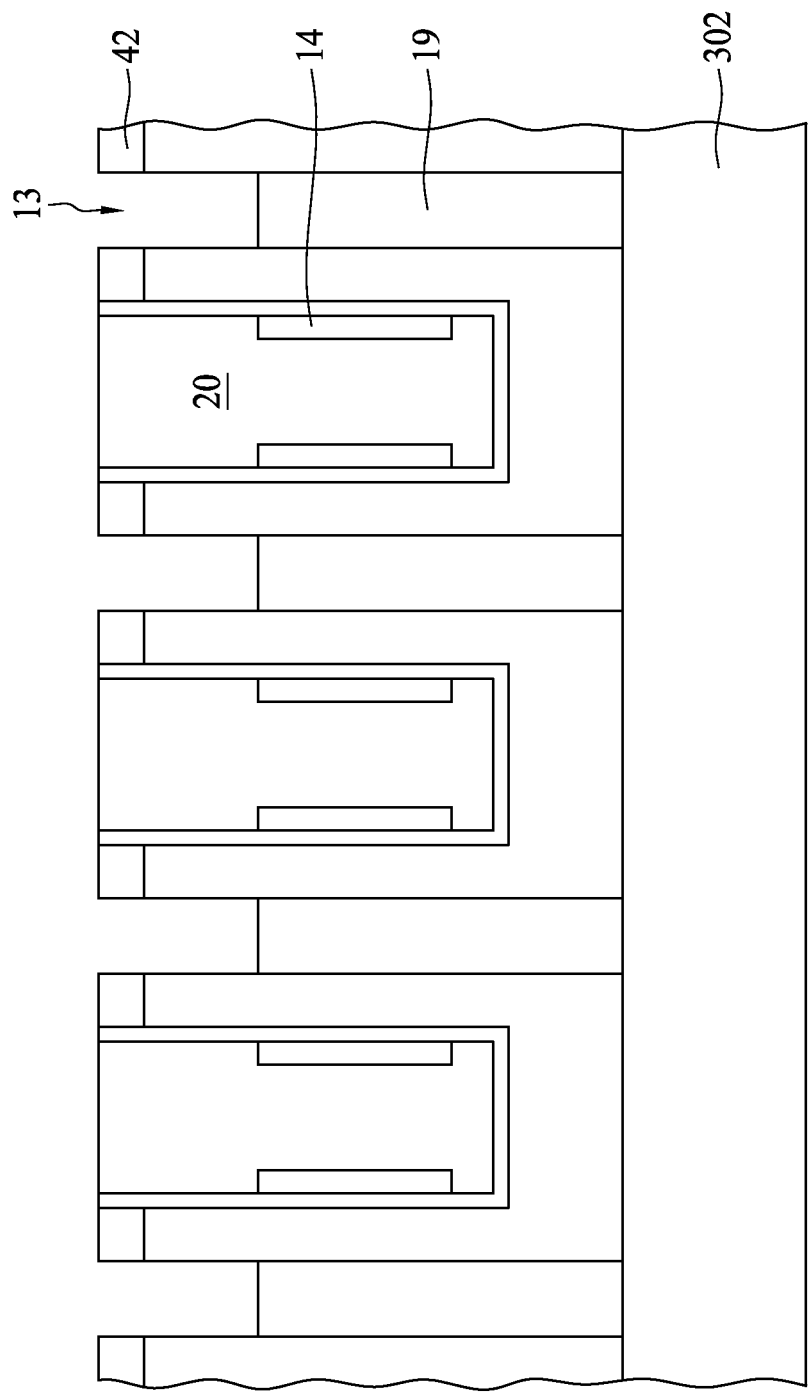
Figure 19:
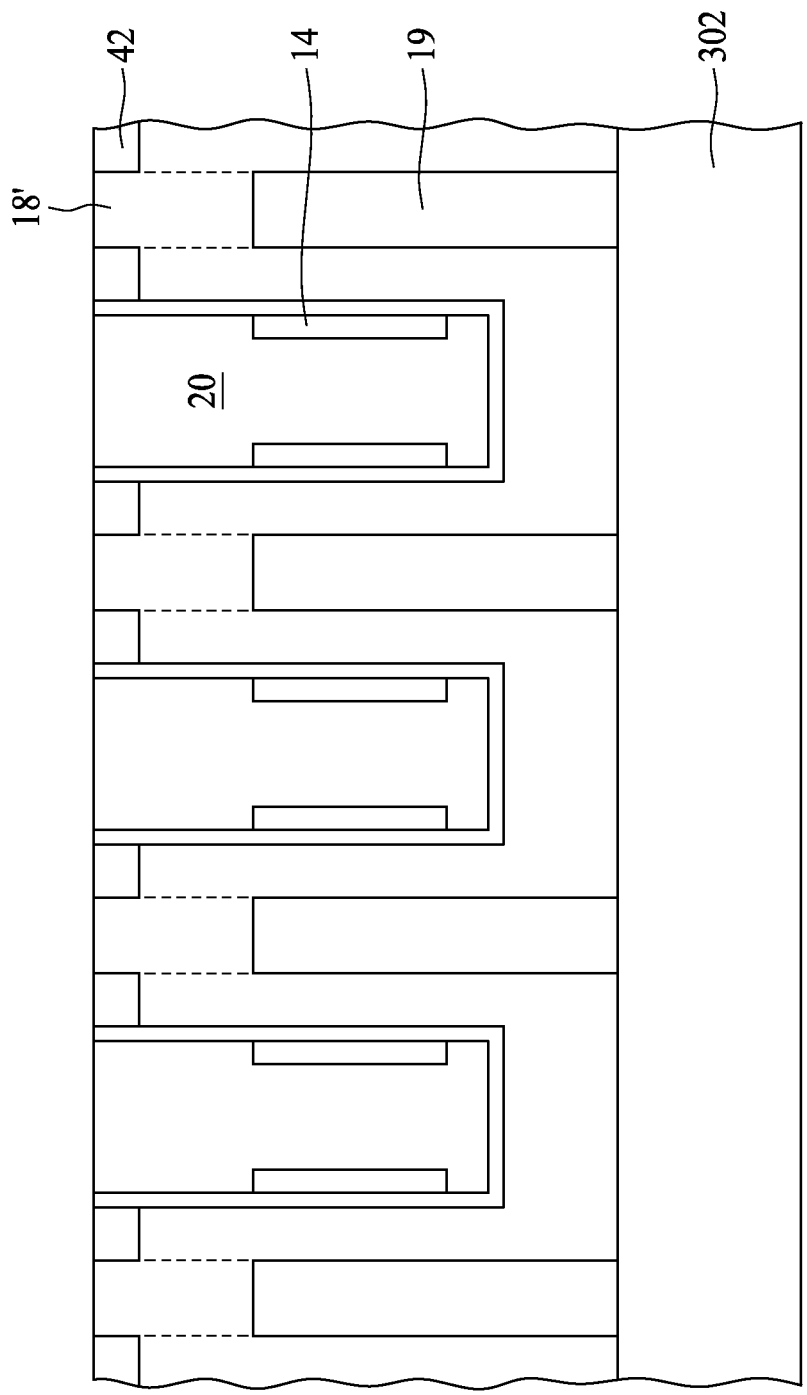

In another embodiment of the present invention, the fabrication processes shown in FIG. 3 to FIG. 15 are performed, and conductive material 23 such as titanium nitride is then deposited to fill the trenches 13, as shown in FIG. 17. A recess etch process follows to remove a portion of the conductive material 23, while leaving a portion of the conductive material 23 in the trenches 13 to form a potential lines 19 in the trenches 13 as shown in FIG. 18. Dielectric material is then deposited to fill the trenches 13, and a CMP process stopped at the silicon nitride layer 42 is then performed to form trench fillers 18', as shown in FIG. 19. Thereafter, as shown in FIG. 2, capacitors 16 and bit lines 17 are formed, connecting respective source/drain regions 114 to form the memory device 2.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device, comprising:
   a plurality of isolations and a plurality of trench fillers arranged in an alternating manner in a direction, wherein a width, measured in the direction, of the trench filler is smaller than that of the isolation;
   a plurality of mesa structures between the plurality of isolations and the plurality of the trench fillers, each mesa structure including at least one paired source/drain regions and at least one channel base region corresponding to the paired source/drain regions; and
   a plurality of word lines each overlying a side surface, adjacent the respective isolation, of the respective mesa structure, and arranged adjacent the channel base region.

2. The memory device of claim 1, wherein the plurality of trench fillers comprise a dielectric material.

3. The memory device of claim 1, wherein the plurality of trench fillers comprise a conductive material disposed below the dielectric material.

4. The memory device of claim 1, further comprising a plurality of isolation pillars corresponding to the paired source/drain regions, wherein the channel base region includes two separated protrusions extending upwards and separately connecting the paired source/drain regions, and the plurality of isolation pillars are disposed between the two protrusions of the channel base region and the respective paired source/drain regions.

5. The memory device of claim 4, further comprising at least one capacitor electrically coupled to one of the paired source/drain regions and at least one bit line electrically coupled to the other one of the paired source/drain regions.

6. The memory device of claim 1, wherein the width of the plurality of isolations are approximately equal to a minimum feature size of the lithographic process.

7. The memory device of claim 1, wherein the plurality of word lines comprise titanium nitride.

8. The memory device of claim 1, wherein two adjacent isolations are separated by a distance substantially equal to a minimum feature size of the lithographic process.

9. A memory device, comprising:
   first and second isolations having a width, separated from each other by a distance approximately equal to the width;
   a trench filler between the first and second isolations;
   a first mesa structure disposed between the second isolation and the trench filler, each of the first mesa structure and the second mesa structure including at least one paired source/drain regions and at least one channel base region corresponding to the paired source/drain regions;
   a first word line between the first isolation and the first mesa structure, adjacent the channel base region of the first mesa structure; and
   a second word line between the second isolation and the second mesa structure, adjacent the channel base region of the second mesa structure.

10. The memory device of claim 9, wherein the trench filler comprises a dielectric material.

11. The memory device of claim 10, wherein the trench filler comprises a conductive material below the dielectric material.

12. The memory device of claim 9, further comprising a plurality of isolation pillars corresponding to the paired source/drain regions of the first and second mesa structures, wherein the channel base region includes two separated protrusions extending upwards and separately connecting the respective paired source/drain regions, and the isolation pillar is disposed between the two protrusions of the channel base region and the respective paired source/drain regions.

13. The memory device of claim 9, further comprising at least one capacitor electrically coupled to one of the paired source/drain regions and at least one bit line electrically coupled to the other one of the paired source/drain regions.

14. The memory device of claim 10, wherein the width is approximately equal to a minimum feature size of the lithographic process.

15. The memory device of claim 10, wherein the first and second word lines comprise titanium nitride.

16. The memory device of claim 10, wherein the trench filler has a width of approximately one-half of a minimum feature size of the lithographic process.

* * * * *